United States Patent [19]

Eck et al.

[11] Patent Number: 5,402,064
[45] Date of Patent: Mar. 28, 1995

[54] MAGNETORESISTIVE SENSOR CIRCUIT WITH HIGH OUTPUT VOLTAGE SWING AND TEMPERATURE COMPENSATION

[75] Inventors: Robert E. Eck, Goleta; Paul T. Bryant, Santa Barbara, both of Calif.

[73] Assignee: Santa Barbara Research Center, Goleta, Calif.

[21] Appl. No.: 939,190

[22] Filed: Sep. 2, 1992

[51] Int. Cl.$^6$ .................. G01B 7/14; G01R 33/09
[52] U.S. Cl. .................... 324/207.21; 324/207.12; 324/235; 324/207.23; 327/510; 327/513
[58] Field of Search ............. 324/207.21, 207.20, 324/207.14, 207.13, 235, 252, 251, 207.12; 338/32 R; 360/113; 307/309

[56] References Cited

U.S. PATENT DOCUMENTS

| | | | |
|---|---|---|---|
| 3,846,697 | 11/1974 | Cila et al. | 324/207.21 X |
| 4,075,671 | 2/1978 | Cheatham et al. | 324/252 X |
| 4,359,685 | 11/1982 | Eguchi et al. | 324/207.21 |
| 4,480,248 | 10/1984 | Sudo et al. | 324/252 X |
| 4,521,727 | 6/1985 | Atherton et al. | 323/294 |
| 4,727,270 | 2/1988 | Payne | 324/207.12 X |
| 4,727,323 | 2/1988 | Zabler | 324/207.21 X |
| 5,038,130 | 8/1991 | Eck | 324/207.21 X |
| 5,168,244 | 12/1992 | Muranaka | 330/257 |
| 5,168,274 | 12/1992 | Wakamatsu | 324/207.12 X |

FOREIGN PATENT DOCUMENTS 0450910 10/1991 European Pat. Off. .
0484859  5/1992 European Pat. Off. .

*Primary Examiner*—Sandra L. O'Shea
*Assistant Examiner*—Warren S. Edmonds
*Attorney, Agent, or Firm*—Georgann S. Grunebach; Terje Gudmestad; W. K. Denson-Low

[57] ABSTRACT

A magnetoresistor (MR) and a non-magnetoresistor (NMR) are formed of indium antimonide or other magnetoresistive material in thermal proximity to each other on an integrated circuit substrate (100). Hall effect shorting strips (104) are formed on the magnetoresistor (MR) to make it much more magnetoresistive than the non-magnetoresistor (NMR). A current mirror (80) causes equal constant currents (I2) which do not vary with temperature to flow through the magnetoresistor (MR) and non-magnetoresistor (NMR), such that magnetoresistor and non-magnetoresistor voltages are developed thereacross respectively. The magnetoresistor and non-magnetoresistor voltages vary equally in accordance with temperature. The magnetoresistor voltage also varies in accordance with applied magnetic flux. A comparator (66) subtracts the non-magnetoresistor voltage from the magnetoresistor voltage to produce an output signal (Vout) with the temperature variation canceled, and which thereby varies only in accordance with magnetic flux. The current mirror (80) has an essentially infinite equivalent load impedance, such that the magnetoresistor voltage varies to a maximum possible extent with variation of the resistance of the magnetoresistor (MR) and the sensor (70) has a maximum possible output voltage swing.

18 Claims, 3 Drawing Sheets

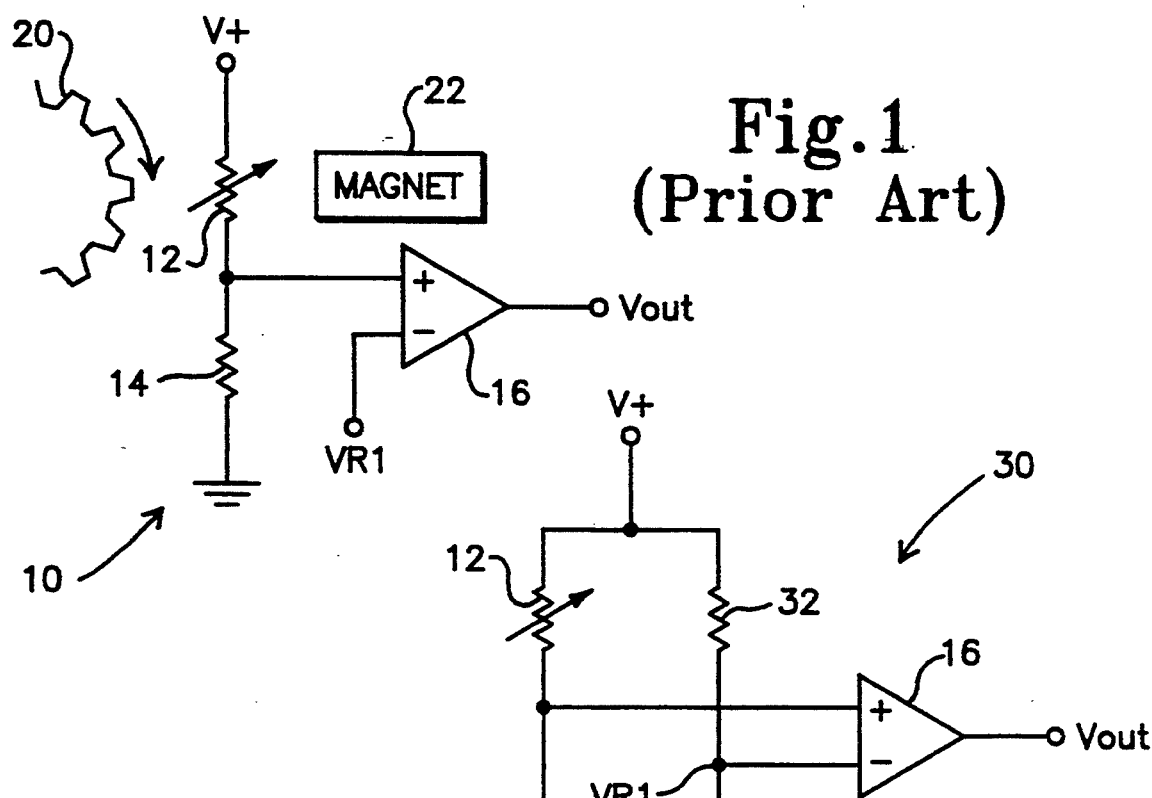
Fig.1 (Prior Art)
Fig.2 (Prior Art)
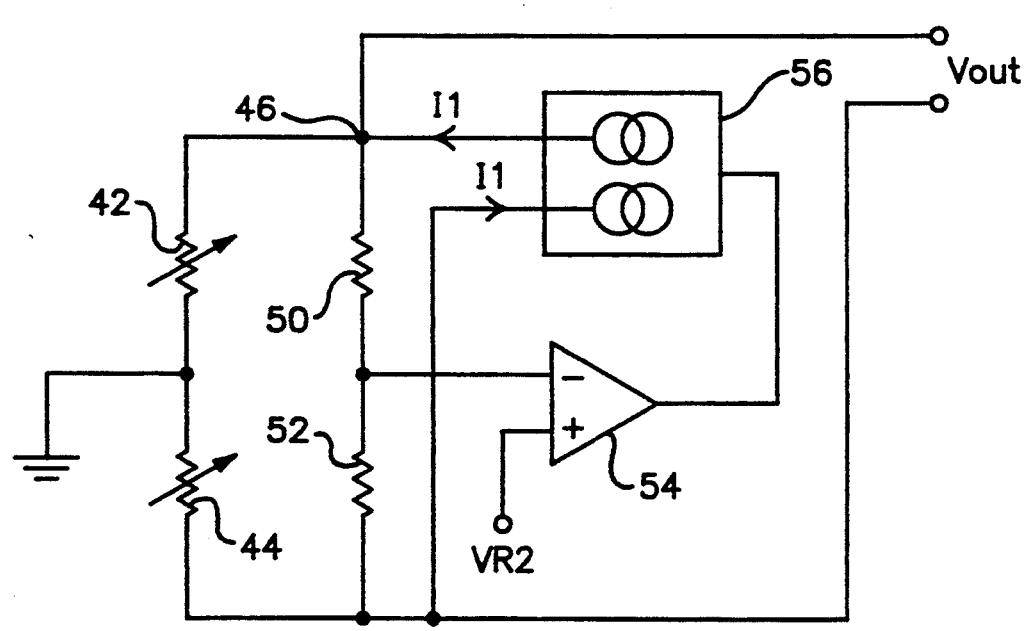
Fig.3 (Prior Art)

MAGNETORESISTIVE SENSOR CIRCUIT WITH HIGH OUTPUT VOLTAGE SWING AND TEMPERATURE COMPENSATION

BACKGROUND OF THE INVENTION

1. Field of the Invention

The present invention generally relates to the sensing of magnetic fields, and more specifically to a magnetoresistive sensor suitable for fabrication using integrated circuit technology which produces a high output voltage and is insensitive to temperature variation.

2. Description of the Related Art

Magnetoresistive sensors are widely used for sensing magnetic field flux, and more specifically translational and rotational speed and position as analogous variations of magnetic flux. A basic magnetoresistive sensor 10 of known design is illustrated in FIG. 1, and includes a magnetoresistor 12 which is connected in series with a fixed resistor 14. A source voltage V+ is applied across the resistors 12 and 14, whereas the junction of the resistors 12 and 14 is connected to the non-inverting input of an operational amplifier 16. A reference voltage VR1 is applied to the inverting input of the amplifier 16.

A toothed wheel 20 made of a ferromagnetic material such as steel is mounted for integral rotation on a member (not shown) whose rotational speed or position is to be sensed. The wheel 20 may be mounted on a crankshaft of an automotive vehicle, for example, for measuring engine speed (RPM), or on a wheel shaft for measuring vehicle speed.

The magnetoresistor 12 is disposed between the wheel 20 and a magnet 22 such that a magnetic field is developed between the wheel 20 and magnet 22, with the magnetic field flux passing through the magnetoresistor 12. The resistance of the magnetoresistor 12 increases as the magnitude of the applied magnetic flux increases. The flux is maximum when one of the teeth of the wheel 20 is aligned with the magnet 22, and minimum when one of the gaps between the teeth is aligned with the magnet 22.

As the magnetic flux and thereby the resistance of the magnetoresistor 12 increase, the voltage drop across the magnetoresistor 12 increases and the voltage at the junction of the resistors 12 and 14 and thereby at the noninverting input of the amplifier 16 decreases, and vice-versa. The reference voltage VR1 is selected to be equidistant between the minimum and maximum voltages appearing at the junction of the resistors 12 and 14. The amplifier 16 produces an output voltage Vout.

As each tooth of the wheel 20 passes through alignment with the magnet 22, the voltage at the non-inverting input of the amplifier 16 crosses below the voltage at the inverting input, and the amplifier 16 produces a negative output voltage Vout. As each gap between teeth of the wheel 20 passes through alignment with the magnet 22, the voltage at the non-inverting input of the amplifier 16 crosses above the voltage at the inverting input, and the amplifier 16 produces a positive output voltage Vout. In this manner, the sensor 10 produces a periodic output signal Vout at a frequency which is proportional to the rotational speed of the wheel 20.

FIG. 2 illustrates a sensor 30 which is similar to the sensor 10, but further includes a voltage divider consisting of resistors 32 and 34 which produces the reference voltage VR1.

The fixed resistor 14 constitutes an output load for the magnetoresistor 12. As the resistance of the magnetoresistor 12 increases, the voltage thereacross increases as described above. However, the current flow through the resistors 12 and 14 decreases by an amount corresponding to the increased resistance of the magnetoresistor 12. Thus, the change in voltage across the magnetoresistor 12 is less than that which would be produced if the current through the resistors 12 and 14 were maintained constant.

This limits the output voltage of the sensor 10 to substantially less than a maximum possible value. In the impedance matched case where the resistances of the resistors 12 and 14 are equal, the output voltage swing is one-half that which would be produced if the current through the resistors 12 and 14 did not vary with the resistance of the magnetoresistor 12.

In addition to the limited output swing discussed above, a typical magnetoresistor 12, that is formed of indium antimonide or similar material is very sensitive to temperature variations. A high performance magnetoresistive sensor is typically required to operate over a temperature range of $-40°$ C. to $+250°$ C. The resistance of the magnetoresistor 12 decreases as the temperature increases, with the resistance at the high end of the temperature range being on the order of one-half the resistance at the low end. This variation of resistance in accordance with temperature produces a corresponding variation in output voltage, which is a major source of error.

U.S. Pat. No. 5,038,130, entitled "SYSTEM FOR SENSING CHANGES IN A MAGNETIC FIELD", issued Aug. 6, 1991, to R. Eck (one of the present inventors) et al, discloses the fabrication of resistors 12 and 14 from the same magnetoresistive material and having the same geometry, using integrated circuit technology. Hall effect shorting strips or other structures are formed on the magnetoresistor 12 such that it has a much higher magnetoresistance than the resistor 14.

The resistances of the resistors 12 and 14 vary in accordance with temperature in the same manner, such that the voltages across the resistors 12 and 14 and thereby the voltage at the non-inverting input of the amplifier 16 do not vary with temperature. However, the magnetoresistor 12 is still resistively loaded by the fixed resistor 14, and the output voltage is still undesirably limited thereby.

U.S. Pat. No. 4,727,323, entitled "MAGNETORESISTIVE DIFFERENTIAL SENSOR SYSTEM", issued Feb. 23, 1988, to E. Zabler discloses a sensor which is illustrated in present FIG. 3 and designated as 40. The sensor 40 includes magnetoresistors 42 and 44 connected in series between points 46 and 48, with the junction of the magnetoresistors 42 and 44 grounded.

Fixed resistors 50 and 52 are also connected in series across the points 46 and 48, with the junction of the resistors 50 and 52 connected to the inverting input of an operational amplifier 54. A reference voltage VR2 is applied to non-inverting input of the amplifier 54, with the output of the amplifier 54 applied to control a dual current source 56. The output voltage Vout of the sensor 40 is taken across the points 46 and 48.

The current source 56 sources a current I1 into the point 46 and sinks an equal current I1 out of the point 48. The current I1 is maintained constant at a given value of temperature, but is controlled by the amplifier 54 to vary in accordance with temperature. The resistances of the magnetoresistors 42 and 44, and thereby the voltage at the inverting input of the amplifier 54 vary with temperature.

The amplifier 54 compares the voltages at its two inputs and controls the source 56 in accordance with the difference therebetween to increase the current I1 as the resistances of the magnetoresistors 42 and 44 increase, and vice-versa, to maintain the voltages across the magnetoresistors 42 and 44 and thereby the output voltage Vout constant with temperature.

Although attaining temperature compensation, the arrangement of FIG. 3 requires a complicated dual current source and feedback loop to vary the current I1 as a function of temperature, and is difficult to implement in an integrated circuit.

SUMMARY OF THE INVENTION

The present invention overcomes the problems of resistive loading and temperature sensitivity in a manner which can be advantageously implemented using integrated circuit technology.

More specifically, a magnetoresistive integrated circuit sensor embodying the present invention includes a magnetoresistor and a non-magnetoresistor which are formed of indium antimonide or other magnetoresistive material in thermal proximity to each other on an integrated circuit substrate. Hall effect shorting strips are formed on the magnetoresistor to make it much more magnetoresistive than the non-magnetoresistor.

A current mirror causes equal constant currents which do not vary with temperature to flow through the magnetoresistor and non-magnetoresistor, such that magnetoresistor and non-magnetoresistor voltages are developed thereacross respectively. The magnetoresistor and non-magnetoresistor voltages vary equally in accordance with temperature. The magnetoresistor voltage also varies in accordance with the applied magnetic flux being sensed.

A comparator subtracts the non-magnetoresistor voltage from the magnetoresistor voltage to produce an output signal in which the temperature variation is canceled, and which thereby varies only with magnetic flux. The current mirror has an essentially infinite equivalent load impedance, such that the magnetoresistor voltage undergoes a large swing as the magnetoresistance varies; this is reflected in a large output voltage swing for the sensor.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 1 is an electrical schematic diagram illustrating a prior art magnetoresistive sensor;

FIG. 2 illustrates a modified version of the sensor of FIG. 1;

FIG. 3 illustrates another prior art magnetoresistive sensor;

DETAILED DESCRIPTION OF THE INVENTION

Figure 4:
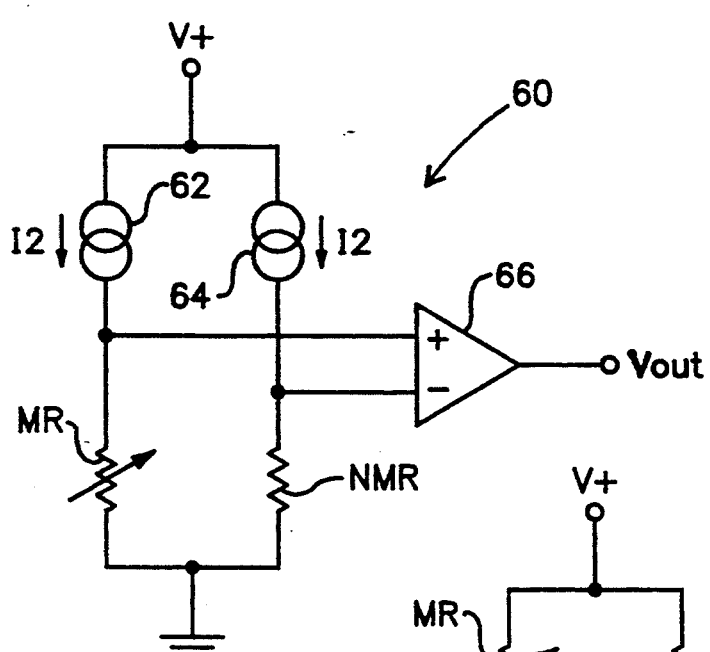
FIG. 4 is an electrical schematic diagram illustrating a first embodiment of a magnetoresistive sensor embodying the present invention.

A magnetoresistive integrated circuit sensor 60 embodying the present invention is illustrated in FIG. 4, and includes a magnetoresistor MR and a non-magnetoresistor NMR which are connected in series with constant current sources 62 and 64 respectively across a source voltage V+. The sources 62 and 64 cause equal constant currents I2 to flow through the resistors MR and NMR respectively. In accordance with the invention, the currents I2 do not vary with temperature or any other design parameter.

The resistors MR and NMR are exposed to magnetic flux for sensing, for example, in the manner illustrated in FIG. 1. The resistance of the non-magnetoresistor NMR is preferably equal to the resistance of the magnetoresistor MR when exposed to a bias magnetic flux, or equidistant between the minimum and maximum resistances of the magnetoresistor MR when exposed to minimum and maximum applied magnetic flux respectively.

The resistors MR and NMR are formed of the same magnetoresistive material, preferably indium antimonide, on a gallium arsenide substrate. Other applicable magnetoresistive materials include, but are not limited to, indium arsenide, indium phosphide and gallium arsenide. As described in the above referenced patent to Eck, Hall effect shorting strips or other structure (not shown) are provided to the magnetoresistor MR such that the magnetoresistance thereof is much greater than that of the non-magnetoresistor NMR.

Ideally, the non-magnetoresistor NMR has zero magnetoresistance, such that the resistance thereof is unaffected by magnetic flux, although in actual practice the magnetoresistance of the non-magnetoresistor NMR may have some small value. In accordance with the basic principles of the invention, the resistance of the non-magnetoresistor NMR varies only in accordance with temperature, whereas the resistance of the magnetoresistor MR varies in accordance with both temperature and applied magnetic flux.

The resistors MR and NMR, except for the provision of the additional structure which increases the magnetoresistance of the magnetoresistor MR, are preferably essentially similar. The resistors MR and NMR are disposed in thermal proximity to each other such that they are exposed to the same temperature during operation of the sensor 60. This can be accomplished with precision by fabricating the resistors MR and NMR simultaneously using integrated circuit fabrication technology. Any variation in thickness or other characteristics for one resistor MR or NMR will be matched by corresponding variations in the other resistor MR or NMR due to the common processing.

Due to the common configuration of the resistors MR and NMR, the resistances thereof will vary with temperature in a substantially identical manner. As the temperature increases, the resistances of the resistors MR and NMR will decrease by the same amount and vice-versa. Since the same constant current I2 flows through both resistors MR and NMR, the voltages developed across the resistors MR and NMR will also vary equally in accordance with changes in temperature.

The voltage across the magnetoresistor MR is applied to the non-inverting input of a differential or operational amplifier 66, whereas the voltage across the non-magnetoresistor NMR is applied to the inverting input of the amplifier 66. As the temperature increases, the resistances of the resistors MR and NMR decrease and the voltages thereacross decrease by equal amounts and vice-versa. The amplifier 66 produces the output voltage Vout as the difference between the voltages across the resistors MR and NMR. Since these voltages vary identically with temperature, the difference therebetween and the output voltage Vout are unaffected by temperature variations over the operating temperature range of the sensor 60.

As the applied magnetic flux increases, the resistance of the magnetoresistor MR increases, the voltage across the magnetoresistor MR becomes higher than the voltage across the non-magnetoresistor NMR, and the output voltage Vout goes positive. The output voltage Vout conversely goes negative as the magnetic flux decreases.

The current sources 62 and 64 have essentially infinite equivalent load impedance, such that the voltage across the magnetoresistor 12 varies to a maximum possible extent (twice that of the matched impedance case of the prior art circuit of FIG. 1) with variation of the resistance of the magnetoresistor 12. The output voltage swing of the sensor 60 is also twice that which is possible with the circuit of FIG. 1.

Figure 5:
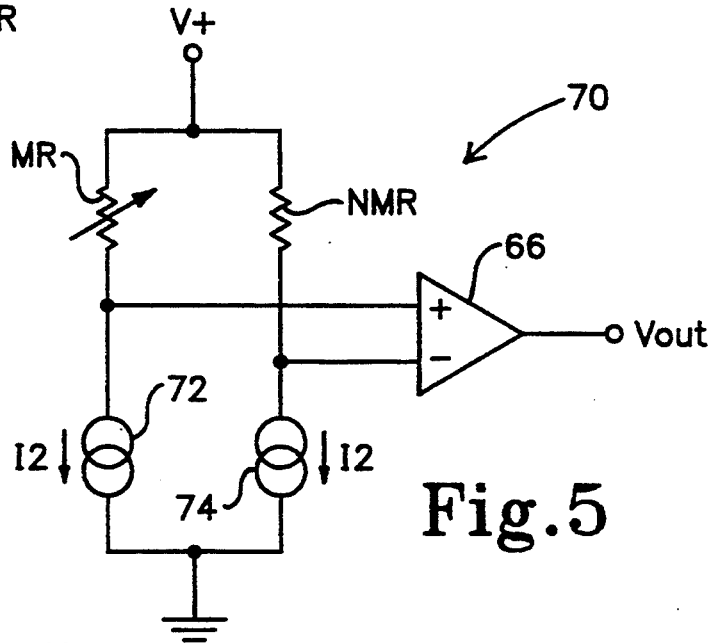
FIG. 5 illustrates a modified version of the sensor of FIG. 4.

FIG. 5 illustrates a modified version of the sensor 60 which is designated as 70. The polarity of the output voltage Vout is reversed relative to that of the sensor 60. More specifically, the relative positions of the resistors MR and NMR and the constant current sources are reversed. In the sensor 70, constant current sources 72 and 74 sink the current I2 from the resistors MR and NMR respectively into ground. As the applied magnetic flux increases, the resistance of the magnetoresistor MR and the voltage thereacross increase, and the output voltage Vout goes negative. The opposite action occurs when the applied magnetic flux decreases.

Figure 6:
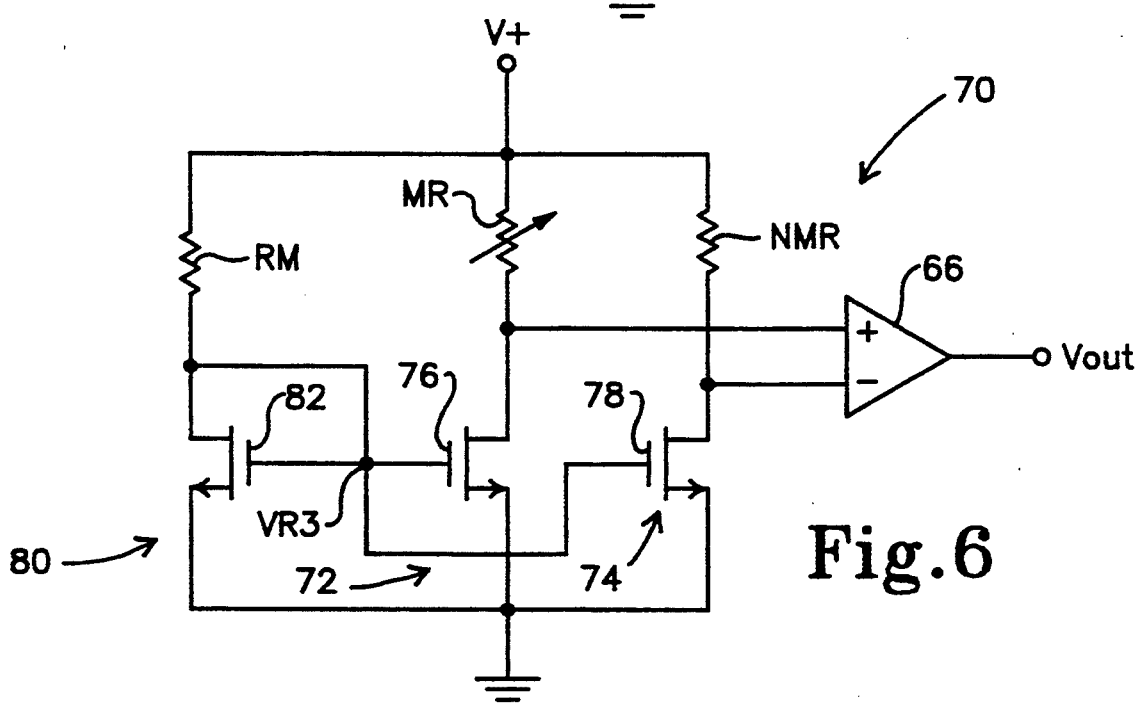
FIG. 6 illustrates the sensor of FIG. 5 including a current mirror implemented by N-channel metal-oxide-semiconductor (NMOS) field-effect transistors (FETs)

The sensor 70 is illustrated in more detail in FIG. 6. The current source 72 includes an NMOS FET 76 having its controlled current path (source/channel/drain) connected in series with the magnetoresistor MR, whereas the current source 74 includes an NMOS FET 78 having its controlled current path connected in series with the non-magnetoresistor NMR.

The FETs 76 and 78 are elements of a current mirror which is designated as 80 and further includes an NMOS FET 82 having its controlled current path connected in series with a fixed master resistor RM. The drain and gate of the FET 82 are interconnected such that the FET 82 functions electrically as a diode. The current control terminals (gates) of the FETs 76, 78 and 82 are also interconnected.

Due to the fabrication of the sensor 70 as an integrated circuit, the FETs 76, 78 and 82 have substantially identical electrical characteristics. The master resistor RM is preferably a conventional resistor, formed of aluminum, polysilicon or other metal which is much less sensitive to temperature variation than the resistors MR and NMR which are formed of a magnetoresistive material. Ideally, the resistance of the master resistor RM will not vary at all over the operating temperature range of the sensor 70.

The gate voltage of the FET 82 is set at a predetermined operating point or reference voltage VR3 which is a function of the resistance of the master resistor RM, the value of the source voltage V+ and the current/voltage characteristic of the FET 82 with the gate voltage being equal to the drain voltage thereof. The voltage VR3 is selected such that the current flow through the FET 82 will be I2.

The voltage VR3 is also applied to the gates of the FETs 76 and 78. In accordance with fundamental transistor action, since the gate voltages of the FETs 76, 78 and 82 are equal, the current flow therethrough must also be equal. In this manner, the current I2 is "mirrored" from the FET 82 to the FETs 76 and 78, and the current flow through the FETs 76 and 78 and thereby the resistors MR and NMR are maintained constant at I2.

It will be noted that the FETs 76 and 78 operate as transconductance amplifiers, and that the current therethrough is determined by the reference voltage VR3. It is within the scope of the invention to replace the FET 82 and master resistor RM with an alternative reference voltage source, such as a precision voltage source (not shown), which applies the voltage VR3 to the gates of the FETs 76 and 78.

It will be understood that the present invention is not limited to implementation using NMOS FETs, and that bipolar or other types of transistors can alternatively be used. In the case of bipolar transistors, the controlled current path includes the emitter, base and collector and the current control terminal is the base terminal.

Figure 7:
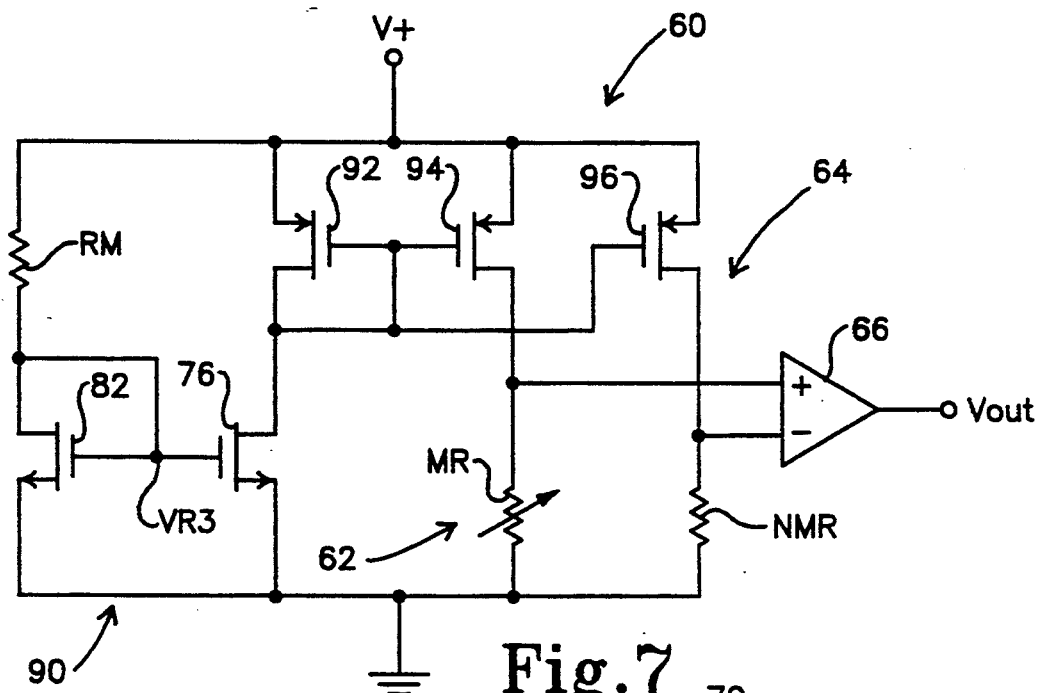
FIG. 7 illustrates the sensor of FIG. 4 including a current mirror implemented by complementary metal-oxide-semiconductor (CMOS) field-effect transistors (FETs)

FIG. 7 illustrates the sensor 60 of FIG. 4 including a current mirror 90 which is implemented using CMOS architecture. The current mirror 90 includes the NMOS FETs 76 and 82 which function as described with reference to FIG. 6. However, the NMOS FET 78 is omitted, and a PMOS FET 92 has its controlled current path connected between the FET 76 and the source voltage V+. The controlled current paths of PMOS FETs 94 and 96 are connected between the resistors MR and NMR respectively and the source voltage V+. The gate of the FET 92 is connected to the drain thereof, and also to the gates of the FETs 94 and 96.

Since the current through the FET 76 is mirrored to I2 by the FET 82, this same current I2 must flow through the FET 92. The diode-connected FET 92 mirrors the current I2 to the FETs 94 and 96 in the same manner in which the FET 82 mirrors the current I2 to the FET 76. Thus, the constant current I2 is caused to flow through the resistors MR and NMR.

Figure 8:
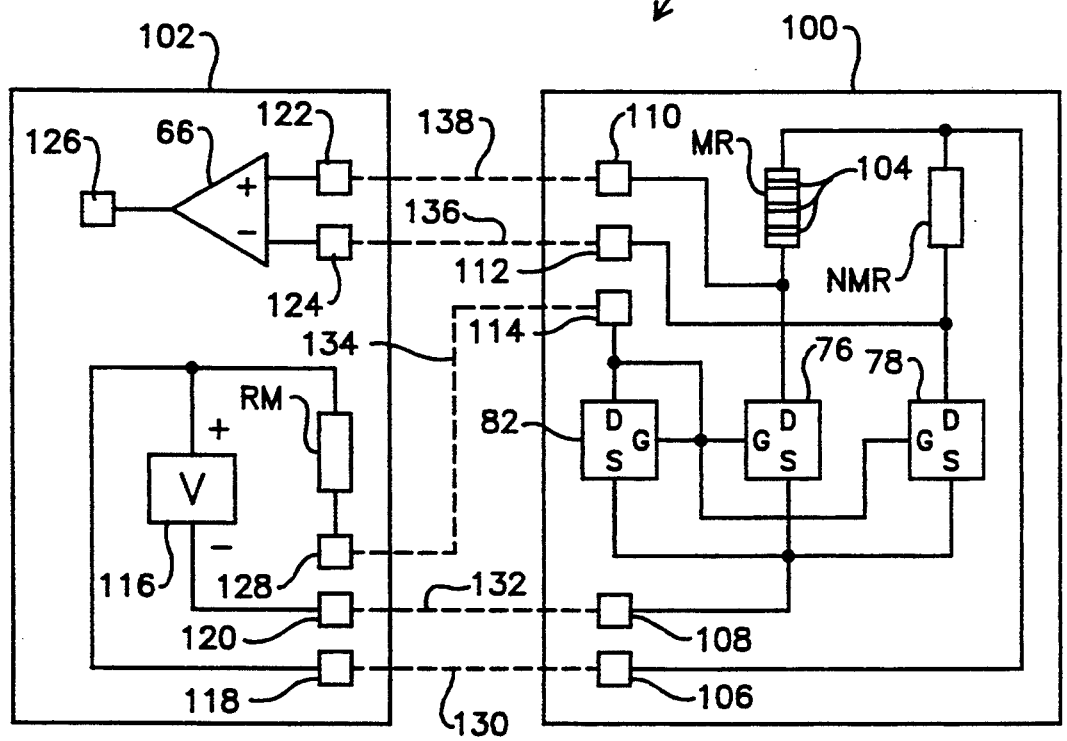
FIG. 8 is a simplified plan view of the sensor of FIGS. 5 and 6 fabricated as two interconnected integrated circuits.

FIG. 8 illustrates how the integrated circuit sensor 70 of FIGS. 5 and 6 can be fabricated on two semiconductor substrates 100 and 102. Where the resistors MR and NMR are formed of indium antimonide, the substrate 100 is preferably a gallium arsenide wafer. However, other material combinations are possible within the scope of the invention. The substrate 102 can also be a gallium arsenide wafer, or formed of some other material.

The resistors MR and NMR and FETs 76, 78 and 82 are fabricated on the substrate 100 using conventional integrated circuit fabrication techniques which are not the particular subject matter of the present invention. Hall effect shorting strips 104 are formed on the magnetoresistor MR to increase the magnetoresistance as described above. The ends of the resistors MR and NMR are connected to a V+ pad 106, whereas the sources of the FETs 76, 78 and 82 are connected to a ground pad 108. The drains of the FETs 76 and 78 are connected to pads 110 and 112 respectively, whereas the drain of the FET 82 is connected to a pad 114.

The amplifier 66, the master resistor RM and a voltage source 116 which supplies the source voltage V+ are fabricated on the substrate 102. The positive and negative terminals of the voltage source 116 are connected to pads 118 and 120 respectively. The non-inverting and inverting inputs of the amplifier 66 are connected to pads 122 and 124 respectively. The output of the amplifier 66 is available at a pad 126. The end of the master resistor RM is connected to a pad 128.

The substrate 102 is preferably located away from the substrate 100 in thermal isolation therefrom such that the components on the substrate 102, especially the master resistor RM, are not exposed to the temperature variations which affect the resistors MR and NMR. The pads 106,118, 108,120, 114,128, 112,124 and 110,122 are interconnected by lines 130, 132, 134, 136 and 138 respectively.

Although the sensor 70 is illustrated in FIG. 8 as including two separate substrates 100 and 102, it is within the scope of the invention to fabricate the entire sensor 70 on a single substrate. In either case, it is preferred to provide thermal isolation for the master resistor RM so that the resistance thereof will be unaffected by temperature variations.

While several illustrative embodiments of the invention have been shown and described, numerous variations and alternate embodiments will occur to those skilled in the art, without departing from the spirit and scope of the invention.

For example, the resistances of the resistors MR and NMR and the constant currents caused to flow therethrough may be different, rather than equal as described above. It is only required that the voltages across the resistors MR and NMR vary with temperature in a predetermined relationship which can be used to cancel the effect of the variation of resistance with temperature of the magnetoresistor MR. It is further within the scope of the invention to fabricate the non-magnetoresistor NMR of a material which is different from that of the magnetoresistor MR.

Accordingly, it is intended that the present invention not be limited solely to the specifically described illustrative embodiments. Various modifications are contemplated and can be made without departing from the spirit and scope of the invention as defined by the appended claims.

We claim:

1. A magnetoresistive sensor circuit, comprising:
   a magnetoresistor having a resistance which varies with an applied magnetic flux;
   a non-magnetoresistor which is disposed in thermal proximity to the magnetoresistor and has a resistance which is substantially unaffected by said magnetic flux;
   said resistances of the magnetoresistor and non-magnetoresistor varying substantially identically with temperature;
   a non-resistive constant current source means for causing substantially equal and constant currents to flow through the magnetoresistor and non-magnetoresistor to develop mangetoresistor and non-magnetoresistor voltages thereacross respectively; and
   computing means for producing an output signal as a predetermined function of said magnetoresistor and non-magnetoresistor voltages.

2. A magnetoresistive sensor circuit, comprising:
   a magnetoresistor having a resistance which varies with an applied magnetic flux;
   a non-magnetoresistor which is disposed in thermal proximity to the magnetoresistor and has a resistance which is substantially unaffected by said magnetic flux;
   said resistances of the magnetoresistor and non-magnetoresistor varying substantially identically with temperature;
   constant current source means for causing substantially equal and constant currents to flow through the magnetoresistor and non-magnetoresistor to develop mangetoresistor and non-magnetoresistor voltages thereacross respectively in which the constant current source means comprises a current mirror means; and
   computing means for producing an output signal as a predetermined function of said magnetoresistor and non-magnetoresistor voltages.

3. A magnetoresistive sensor circuit, comprising:
   a magnetoresistor having a resistance which varies with an applied magnetic flux;
   a non-magnetoresistor which is disposed in thermal proximity to the magnetoresistor and has a resistance which is substantially unaffected by said magnetic flux;
   said resistances of the magnetoresistor and non-magnetoresistor varying substantially identically with temperature;
   constant current source means for causing substantially equal and constant currents to flow through the magnetoresistor and non-magnetoresistor to develop mangetoresistor and non-magnetoresistor voltages thereacross respectively in which the constant current source means comprises:
   voltage source means;
   a first transistor having a first controlled current path connected in series with the magnetoresistor across the voltage source means, and a first current control terminal;
   a second transistor having a second controlled current path connected in series with the non-magnetoresistor across the voltage source means, and a second current control terminal; and
   reference voltage source means for applying a predetermined reference voltage to said first and second current control terminals; and
   computing means for producing an output signal as a predetermined function of said magnetoresistor and non-magnetoresistor voltages.

4. A circuit as in claim 3, in which the reference voltage source means comprises:
   a fixed resistor;
   a diode-connected third transistor having a third controlled current path connected in series with the fixed resistor across the voltage source means, and a third current control terminal connected in circuit to said first and second current control terminals.

5. A circuit as in claim 4, in which:
   the first, second and third transistors are field-effect transistors;
   each of said first, second and third controlled current paths comprises a source and a drain; and each of said first, second and third current control terminals comprises a gate.

6. A circuit as in claim 4, in which the fixed resistor is thermally isolated from the magnetoresistor and non-magnetoresistor.

7. A circuit as in claim 1, in which the computing means comprises comparator means for producing said output signal in accordance with the difference between said magnetoresistor and non-magnetoresistor voltages.

8. A magnetoresistive integrated circuit sensor, comprising:
a substrate;
a magnetoresistor which is formed on the substrate and has a resistance which varies with temperature and also with an applied magnetic flux;
a non-magnetoresistor which is formed on the substrate in thermal proximity to the magnetoresistor and has a resistance which varies with temperature and is substantially unaffected by said magnetic flux;
a non-resistive constant current source means for causing constant currents to flow through the magnetoresistor and non-magnetoresistor to develop magnetoresistor an non-magnetoresistor voltages thereacross respectively which vary substantially equally with temperature; and
computing means for producing an output signal as a predetermined function of said magnetoresistor and non-magnetoresistor voltages.

9. A magnetoresistive integrated circuit sensor, comprising:
a substrate;
a magnetoresistor which is formed on the substrate and has a resistance which varies with temperature and also with an applied magnetic flux;
a non-magnetoresistor which is formed on the substrate in thermal proximity to the magnetoresistor and has a resistance which varies with temperature and is substantially unaffected by said magnetic flux;
constant current source means for causing constant currents to flow through the magnetoresistor and non-magnetoresistor to develop magnetoresistor an non-magnetoresistor voltages thereacross respectively which vary substantially equally with temperature in which the constant current source means comprises a current mirror means; and
computing means for producing an output signal as a predetermined function of said magnetoresistor and non-magnetoresistor voltages.

10. A magnetoresistive integrated circuit sensor, comprising;
a substrate;
a magnetoresistor which is formed on the substrate and has a resistance which varies with temperature and also with an applied magnetic flux;
a non-magnetoresistor which is formed on the substrate in thermal proximity to the magnetoresistor and has a resistance which varies with temperature and is substantially unaffected by said magnetic flux;
constant current source means for causing constant currents to flow through the magnetoresistor and non-magnetoresistor to develop magnetoresistor an non-magnetoresistor voltages thereacross respectively which vary substantially equally with temperature in which the constant current source means comprises:
voltage source means;
a first transistor which is formed on the substrate and has a controlled current path connected in series with the magnetoresistor across the voltage source means, and a first current control terminal;
a second transistor which is formed on the substrate and has a controlled current path connected in series with the non-magnetoresistor across the voltage source means, and a second current control terminal; and
reference voltage source means for applying a predetermined reference voltage to said first and second current control terminals; and
computing means for producing an output signal as a predetermined function of said magnetoresistor and non-magnetoresistor voltages.

11. A sensor as in claim 10, in which the reference voltage source means comprises:
a fixed resistor;
a diode-connected third transistor which is formed on the substrate and has a controlled current path connected in series with the fixed resistor across the voltage source means, and a third current control terminal connected in circuit to said first and second current control terminals.

12. A sensor as in claim 11, in which:
the first, second and third transistors are field-effect transistors;
each of said first, second and third controlled current paths comprises a source and a drain; and
each of said first, second and third current control terminals comprises a gate.

13. A sensor as in claim 12, in which the fixed resistor is thermally isolated from the magnetoresistor and non-magnetoresistor.

14. A sensor as in claim 13, in which the fixed resistor is disposed external of the substrate.

15. A sensor as in claim 8, in which the computing means comprises comparator means for producing said output signal in accordance with the difference between said magnetoresistor and non-magnetoresistor voltages.

16. A sensor as in claim 8, in which:
the magnetoresistor and non-magnetoresistor are formed of a magnetoresistive material; and
the magnetoresistor further comprises a structure which causes the magnetoresistor to have much greater magnetoresistance than the non-magnetoresistor.

17. A sensor as in claim 16, in which said magnetoresistive material is selected from the group consisting of indium antimonide, indium arsenide, indium phosphide and gallium arsenide.

18. A sensor as in claim 16, in which:
the substrate comprises gallium arsenide; and
said magnetoresistive material comprises indium antimonide.

* * * * *